(12) United States Patent
Belkin et al.

(10) Patent No.: US 7,974,325 B2
(45) Date of Patent: Jul. 5, 2011

(54) METHODS AND APPARATUS FOR GENERATING TERAHERTZ RADIATION

(75) Inventors: Mikhail A. Belkin, Austin, TX (US); Federico Capasso, Cambridge, MA (US); Alexey Belyanin, College Station, TX (US)

(73) Assignees: President and Fellows of Harvard College, Cambridge, MA (US); The Texas A&M University System, College Station, TX (US); Harvard University & Medical School, Boston, MA (US)

( * ) Notice: Subject to any disclaimer, the term of this patent is extended or adjusted under 35 U.S.C. 154(b) by 0 days.

(21) Appl. No.: 12/450,211

(22) PCT Filed: Mar. 14, 2008

(86) PCT No.: PCT/US2008/003431
§ 371 (c)(1),
(2), (4) Date: Jan. 7, 2010

(87) PCT Pub. No.: WO2008/143737
PCT Pub. Date: Nov. 27, 2008

(65) Prior Publication Data
US 2010/0135337 A1    Jun. 3, 2010

Related U.S. Application Data

(60) Provisional application No. 60/895,258, filed on Mar. 16, 2007.

(51) Int. Cl.
*H01S 5/00* (2006.01)

(52) U.S. Cl. .................................. 372/46.01; 372/45.01
(58) Field of Classification Search ............... 372/46.01, 372/45.01, 12; 359/330
See application file for complete search history.

(56) References Cited

U.S. PATENT DOCUMENTS

| | | | | |
|---|---|---|---|---|
| 6,144,679 A | * | 11/2000 | Herman et al. | 372/21 |
| 7,054,339 B1 | | 5/2006 | Hu et al. | |
| 7,154,339 B2 | * | 12/2006 | Kramer et al. | 330/295 |
| 7,339,718 B1 | * | 3/2008 | Vodopyanov et al. | 359/326 |
| 2005/0242287 A1 | * | 11/2005 | Hakimi | 250/363.09 |

OTHER PUBLICATIONS

Belkin, M.A. et al., "Intracavity terahertz difference frequency generation in quantum cascade lasers," Optical Terahertz Science and Technology Conference, Mar. 18, 2007, Orlando.

(Continued)

*Primary Examiner* — Minsun Harvey
*Assistant Examiner* — Tuan N. Nguyen
(74) *Attorney, Agent, or Firm* — Wolf, Greenfield & Sacks, P.C.

(57) ABSTRACT

Apparatus and methods for generating radiation via difference frequency generation (DFG). In one exemplary implementation, a quantum cascade laser (QCL) has a significant second-order nonlinear susceptibility ($\chi^{(2)}$) integrated in an active region of the QCL. The QCL is configured to generate first radiation at a first frequency $\omega_1$, second radiation at a second frequency $\omega_2$, and third radiation at a third frequency $\omega_3 = \omega_1 - \omega_2$ based on difference frequency generation (DFG) arising from the non-linear susceptibility. In one aspect, the QCL may be configured to generate appreciable THz radiation at room temperature.

16 Claims, 12 Drawing Sheets

OTHER PUBLICATIONS

Belkin, M.A. et al., "Terahertz quantum cascade laser source based on intracavity difference frequency generation," Nature Photonics, vol. 1, May 1, 2007, pp. 288-292.

Gmachl, C. et al., "Optimized second-harmonic generation in quantum cascade lasers," IEEE Journal of Quantum Electronics, IEEE Service Center, Piscataway, NJ, vol. 39, No. 11, Nov. 1, 2003, pp. 1345-1355.

Franz, K.J. et al., "Evidence of cascaded emission in a dual-wavelength quantum cascade laser," Applied Physics Letters, American Institute of Physics, Melville, NY, vol. 90, No. 9, Feb. 28, 2007.

Kohler, R. et al., "Terahertz quantum cascade lasers," IEEE International Conference on Terahertz Electronics Proceedings, Sep. 9, 2002, pp. 1-6.

Sirtori et al., "Far-infrared generation by doubly resonant difference frequency mixing in a coupled quantum well two-dimensional electron gas system," Applied Physics Letters, vol. 65, No. 4, Jul. 25, 1994, pp. 445-447.

International Search Report and Written Opinion from corresponding International Application No. PCT/US2008/003431 dated Jun. 23, 2009.

* cited by examiner

METHODS AND APPARATUS FOR GENERATING TERAHERTZ RADIATION

GOVERNMENT-SPONSORED RESEARCH

Some of the research relating to the subject matter disclosed herein was sponsored by the United States National Science Foundation, award Nos. NSF-ECS-0547019 and NSF-OISE-0530220, and the United States Air Force Office of Scientific Research, award No. FA9550-05-1-0435, and the United States government has certain rights to some disclosed subject matter.

BACKGROUND

The terahertz (THz) spectral range (f≈1-10 THz; λ≈30-300 micrometers; generally between the far-infrared and microwave bands) has long been devoid of efficient, narrowband and tunable semiconductor sources and, in particular, compact electrically-pumped room temperature semiconductor sources. For some time, a p-doped Germanium laser was the only available semiconductor source in the THz region; however, this source can only work at temperatures below that of liquid nitrogen (i.e., it requires cryogenic cooling).

Recently, semiconductor-based Quantum-Cascade Lasers (QCLs) have been developed for the THz spectral range with maximum operating temperatures in pulsed mode reported at 178 degrees Kelvin (with emission frequency at ~3 THz). Nevertheless, some serious limitations are intrinsic to these lasers. First, their tunability is inherently limited due to the narrowness of the gain spectrum. Second, their operating temperature will likely remain restricted to cryogenic temperatures due to the fundamental requirement of population inversion across the low-energy THz transition; in particular, due to the narrow energy band transitions characteristic of THz radiation, as operating temperature increases there is more opportunity for non-radiative depletion of the higher energy state as additional channels of electron relaxation become available, thereby impeding population inversion. Alternative sources, based on photoconductive switches or mixer technology, can operate at room temperature but have low efficiency, large size and broad emission band.

In other research efforts involving QCLs, QCLs have been implemented to simultaneously lase at multiple different wavelengths in the mid-infrared spectral band (e.g., ~5 to 10 micrometers). In one such example, a single quantum cascade active region simultaneously generated up to three different wavelengths, and in another example two active regions designed for mid-infrared generation at different wavelengths were integrated in a single QCL waveguide structure, from which two-wavelength generation was achieved at power levels of several hundred milliwatts.

Difference-frequency generation (DFG) is a nonlinear optical process in which two beams at frequencies $\omega_1$ and $\omega_2$ (often referred to as "pump" beams) interact in a medium with second-order nonlinear susceptibility $\chi^{(2)}$ to produce radiation at frequency $\omega=\omega_1-\omega_2$. The intensity of the wave at frequency $\omega=\omega_1-\omega_2$ is given by the expression $$W(\omega = \omega_1 - \omega_2) \frac{\omega^2}{8\varepsilon_0 c^3 n(\omega_1)n(\omega_2)n(\omega)} \quad (1)$$

$$|\chi^{(2)}|^2 \times \frac{W(\omega_1)W(\omega_2)}{S_{eff}} \times l_{coh}^2,$$

where $l_{coh}=1/(|\vec{K}-(\vec{K}_1-\vec{K}_2)|^2+(\alpha/2)^2)$ is the coherence length, $W(\omega_i)$, $n(\omega_i)$, and $\vec{K}_i$ are the power, refractive index, and the wave vector of the beam at frequency $\omega_i$, respectively, $\alpha$ stands for the losses at the difference frequency $\omega$, $S_{eff}$ is the effective area of interaction, and it is assumed that the medium is transparent for both pumps and that the depletion of the pump powers in the DFG process may be neglected. It follows from Eq. (1) that, for efficient DFG, one, needs to use materials with large $\chi^{(2)}$, input beams of high intensity, and achieve low losses and phase matching, $|\vec{K}-(\vec{K}_1-\vec{K}_2)|\approx 0$.

DFG may be employed to generate THz radiation by employing pump frequencies $\omega_1$ and $\omega_2$ in the infrared (IR) or visible spectral ranges, where good laser sources exist. Various research efforts have reported narrowband THz generation at room temperature b$_y$ externally pumping nonlinear optical crystals such as LiNbO$_3$ or GaAs with two continuous wave (CW) or pulsed lasers. One such effort reported CW THz generation based on DFG in LiNbO$_3$ pumped by the outputs from two laser diodes operating at wavelengths around 1.5 micrometers and power levels of approximately 1 W each, wherein the THz output could be tuned between 190 and 200 micrometers (1.5-1.6 THz). The output power of the detected THz signal was in the sub-nanowatt level. These efforts to generate THz radiation via DFG generally rely on low loss and phase matching in connection with the nonlinear medium to improve the conversion efficiency. In particular, they use focused beams from high-intensity pulsed solid-state lasers (usually ~1 GW/cm$^2$, often limited by the damage threshold of the nonlinear crystal) and achieve large coherence length of tens of millimeters by either true phase matching or quasi-phase matching in transparent nonlinear crystals. This approach offers broad spectral tunability and does work at room temperature; however it requires powerful laser pumps and a generally complicated optical setup, ultimately resulting in bulky and unwieldy THz sources.

According to Eq. (1), as the intensity of the signal produced in DFG is proportional to the square of the second-order nonlinear susceptibility, output power based on DFG could be greatly improved if nonlinear materials with higher second-order nonlinear susceptibilities are used. In this regard, research since the late 1980s has established that asymmetric single or coupled quantum well structures with significant optical nonlinearities in the mid- and far-infrared spectral regions can be engineered by tailoring respective energy levels associated with the quantum well structures to correspond with optical transitions within the same band, known as inter-subband transitions. In particular, one study measured a second-order nonlinear susceptibility $\chi^{(2)}$ of $10^6$ pm/V (i.e., four orders of magnitude larger than that of traditional nonlinear crystals such as LiNbO$_3$, GaP, GaAs, etc.) for DFG at 60 micrometers (5 THz) in coupled quantum-well structures.

The mechanism for the foregoing process is depicted in FIG. 1, wherein two mid-infrared beams from CO$_2$ lasers emitting around 10 micrometers (respectively corresponding to energy transitions represented by the arrows 102 and 104) generate a difference-frequency signal at a wavelength of approximately 62 micrometers (corresponding to an energy transition represented by the arrow 106). In principle, such $\chi^{(2)}$ would enable efficient THz generation even for relatively low pump intensities and low coherence lengths. However, high optical nonlinearity in these structures is achieved because all interacting fields are in resonance with the intersubband transitions. This results in strong absorption of the pump beams as well as the THz DFG beam, and thus unavoidably limits THz DFG efficiency.

SUMMARY

The present disclosure is directed generally to inventive apparatus and methods involving quantum cascade lasers (QCL) for generating terahertz (THz) radiation based on difference frequency generation (DFG).

Applicants have recognized and appreciated that the notably high second-order optical nonlinearity exemplified by the process illustrated in FIG. 1 provides a potentially attractive option for implementing a DFG process. However, to practically employ such a process, significant absorption problems need to be substantially mitigated or overcome. Applicants have also recognized and appreciated a solution to these absorption problems, however; specifically, if a population inversion is achieved in a quantum well structure engineered for high second-order nonlinearity, such that most carriers are found in the higher energy level 3 (the uppermost level shown in FIG. 1) while energy levels 1 and 2 are significantly depleted, significant absorption is effectively mitigated. Stated differently, the absorption problem may be addressed by designing an active nonlinear semiconductor device in which the energy states arising from the coupled quantum wells provide both laser gain and significant second-order nonlinear susceptibility $\chi^{(2)}$.

In some prior research efforts, integration of the resonant second-order nonlinear susceptibility with population inversion in a QCL structure has been demonstrated for second-harmonic generation. However, this approach has not previously been adopted for DFG, as the benefits of integrating high $\chi^{(2)}$ and population inversion are accompanied by laser design challenges that are particularly severe for THz DFG. However, Applicants also have overcome such design challenges so as to effectively implement DFG in a QCL structure.

Accordingly, the present disclosure is directed to various embodiments of inventive methods and apparatus that provide THz radiation based on DFG in a QCL. For example, in one embodiment, high second-order nonlinear susceptibility and population inversion are integrated into a QCL that supports generation at two separate mid-infrared frequencies. The basic physical mechanism for generation of THz radiation in these embodiments is resonant DFG in a coupled quantum-well nonlinear region, similar to the process shown in FIG. 1. However, in contrast to prior research based on such structures, according to inventive embodiments of the present disclosure the integrated nonlinear active region has population inversion in energy state 3. Mid-infrared radiation serves as an intracavity optical pump for the process, but resonant absorption of the pump is suppressed because of the population inversion in state 3. Thus, the entire length of the QCL cavity based on such principles can contribute to coherent nonlinear optical generation. This results in a compact semiconductor source of THz radiation that contains both pump lasers and a nonlinear region for DFG. In various aspects, higher operating temperatures and widely tunable THz radiation as compared to previous designs for THz QCLs (not based on DFG) are possible according to the inventive concepts disclosed herein.

In sum, one embodiment disclosed herein is directed to an inventive apparatus, comprising a quantum cascade laser (QCL) having a significant second-order nonlinear susceptibility ($\chi^{(2)}$) integrated in an active region of the QCL, wherein the QCL is configured to generate first radiation at a first frequency $\omega_1$, second radiation at a second frequency $\omega_2$, and third radiation at a third frequency $\omega_3=\omega_1-\omega_2$ based on difference frequency generation (DFG) arising from the nonlinear susceptibility.

Another embodiment is directed to an inventive method, comprising integrating a significant second-order nonlinear susceptibility ($\chi^{(2)}$) in an active region of a quantum cascade laser (QCL) so as to facilitate generation of first radiation at a first frequency $\omega_1$, second radiation at a second frequency $\omega_2$, and third radiation at a third frequency $\omega_3=\omega_1-\omega_2$ based on difference frequency generation (DFG) arising from the nonlinear susceptibility.

It should be appreciated that all combinations of the foregoing concepts and additional concepts discussed in greater detail below (provided such concepts are not mutually exclusive) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

DETAILED DESCRIPTION

Following below are more detailed descriptions of various concepts related to, and embodiments of, inventive methods and apparatus according to the present disclosure for generating terahertz radiation. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

In various embodiments of methods and apparatus according to the present disclosure, exemplary criteria for implementing difference frequency generation (DFG) to provide terahertz (THz) radiation in quantum cascade lasers (QCL) based on two mid-infrared (IR) "pump" sources include: 1) integrating a significant second-order nonlinear susceptibility $\chi^{(2)}$ with population inversion into the active region of the QCL; 2) designing a waveguide that has suitably low losses for both mid-IR pump sources and the THz radiation resulting from DFG; and 3) providing phase matching for DFG. Each of these criteria is discussed in turn below.

Figure 1:
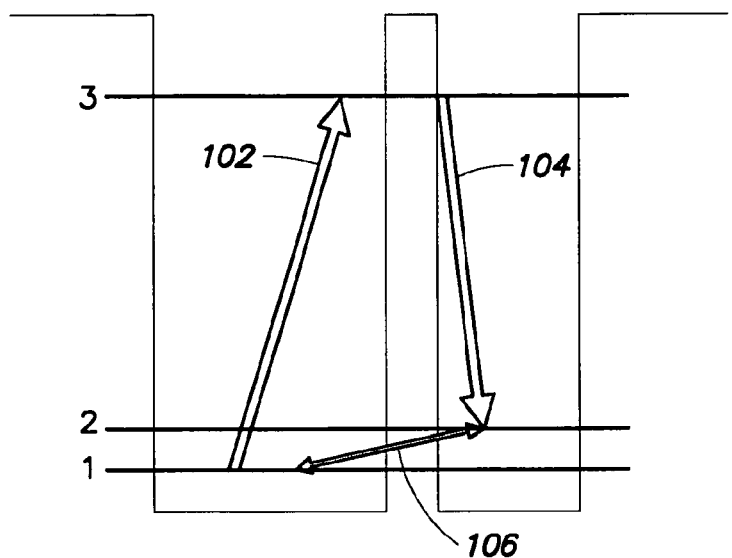
FIG. 1 is an energy level diagram that conceptually illustrates the concept of difference frequency generation (DFG) in asymmetric single or coupled quantum well structures with significant optical nonlinearities.
Figure 2:
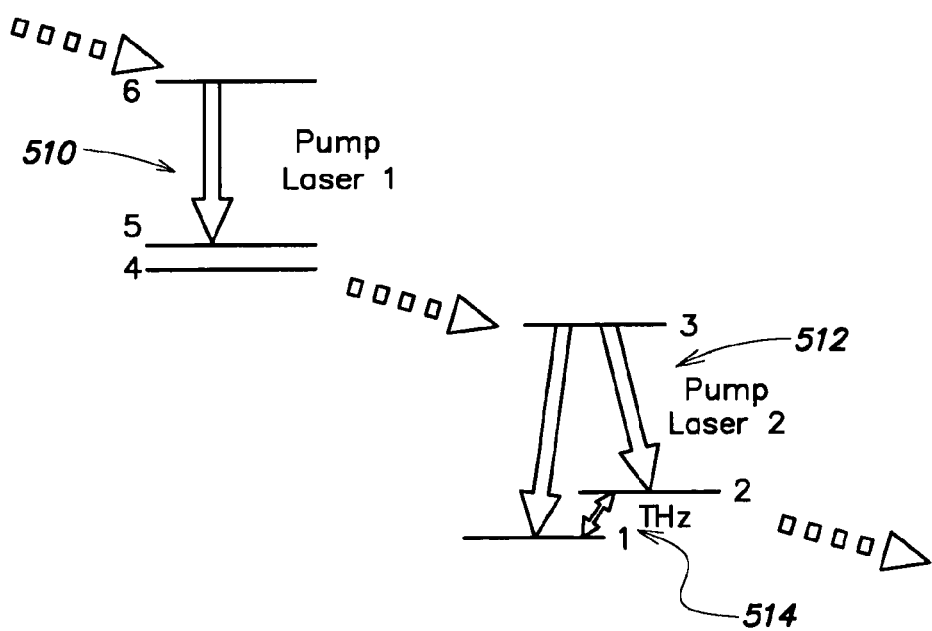
FIG. 2 is an energy level diagram that conceptually illustrates difference frequency generation (DFG) in a quantum cascade laser (QCL) involving two integrated quantum cascade structures forming an active region of the QCL, according to one inventive embodiment of the present disclosure.

According to one embodiment, DFG in a QCL is implemented by employing two quantum cascade structures integrated together to form an active region of the QCL, wherein one QC structure is configured to support resonance of one of the two mid-IR pump sources, the other QC structure is configured to support resonance of the other of the two mid-IR pump sources, and one or both of the QC structures are configured to have a significant second-order nonlinear susceptibility to support THz radiation based on DFG. FIG. 2 conceptually illustrates one example of such an implementation, via energy diagrams for the respective QC structures. In the process shown in FIG. 2, a first QC structure is configured to support lasing at pump frequency $\omega_1$ (corresponding to energy transition 510) while a second QC structure is configured to support lasing at pump frequency $\omega_2$ (corresponding to energy transition 512). In one aspect of this embodiment, the second QC structure also is configured to have a high nonlinear susceptibility $\chi^{(2)}$; hence, it simultaneously serves as a region that supports population inversion and DFG (corresponding to energy transition 514). The dotted arrows in FIG. 2 schematically illustrate the electric current (carrier path) through the device.

In one embodiment, the QC structures conceptually illustrated via energy diagrams in FIG. 2 may be implemented by employing a "three-quantum-well" or "two-phonon resonance" structure as the first QC structure for pump frequency $\omega_1$, and a "bound-to-continuum" structure as the second QC structure for pump frequency $\omega_2$ with integrated nonlinearity. Individually, the respective designs are known to operate at room temperature. Whereas two-phonon or three-quantum-well QC designs do not have high nonlinear susceptibility for DFG, Applicants have recognized and appreciated that the bound-to-continuum QC design can support notably high second-order nonlinear susceptibility for DFG, and that the bound-to-continuum design can be optimized for a number of different cases (e.g., different pump frequencies and resulting DFG).

In view of the foregoing, one embodiment of a QCL configured to generate THz radiation based on DFG comprises an active region having two QC structures or "sub-stacks." In various aspects of this embodiment, a first QC structure includes multiple stages of a "two-phonon resonance" structure that supports a first laser emission wavelength corresponding to the first pump frequency $\omega_1$, and a second QC structure includes multiple stages of a "bound-to-continuum" structure that supports a second laser emission wavelength corresponding to the second pump frequency $\omega_2$ and at the same time has an appreciable second-order nonlinear susceptibility $\chi^{(2)}$ for THz DFG. In one exemplary implementation based on this embodiment, the first QC structure may include 20 stages of a two-phonon resonance structure that supports a laser emission wavelength of approximately 7.6 micrometers for the first pump frequency $\omega_1$ (and has a relatively small $\chi^{(2)}$ for DFG), and the second QC structure may include 30 stages of a bound-to-continuum structure that supports a laser emission wavelength of approximately 8.7 micrometers corresponding to the second pump frequency $\omega_2$. Furthermore, the second QC structure is configured to have a significantly large $\chi^{(2)}$ for THz DFG (e.g., at approximately 60 micrometers).

Figure 3:
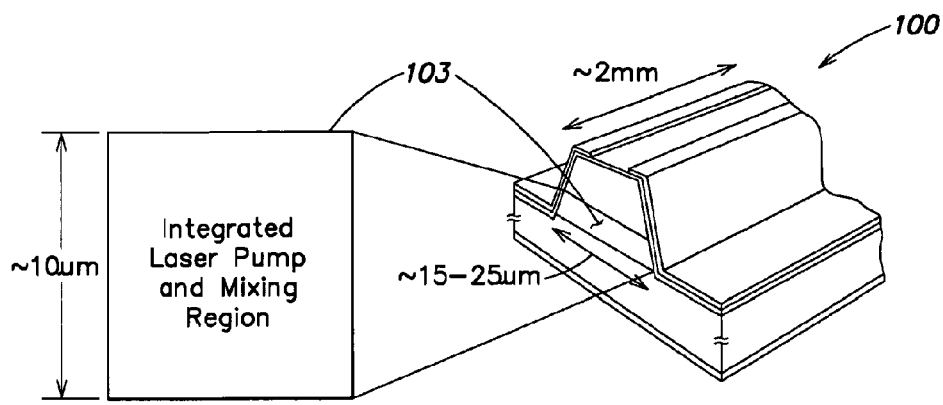
FIG. 3 illustrates a general layout and scale of an exemplary QCL configured to generate THZ radiation based on DFG in an active region, according to one inventive embodiment of the present disclosure.

FIG. 3 illustrates a general layout and scale of an exemplary QCL 100 configured to generate THZ radiation based on DFG in an active region 103, and FIGS. 4($a$), ($b$), ($c$) and ($d$) illustrate additional details of QCL fabrication, structure and operating characteristics, including waveguide structure, refractive index profile, and waveguide modes for mid-infrared and terahertz wavelengths, according to one embodiment of the present disclosure based on the design considerations discussed above in connection with FIG. 2 (two QC structures in an active region of a QCL). In one implementation, such a QCL may be based on InGaAs/AlInAs heterostructures, grown by Molecular Beam Epitaxy (MBE) and lattice-matched to an InP substrate.

More specifically, with reference to FIG. 4($a$), in one embodiment MBE growth begins on an InP substrate 122, n-doped to n=1.3-1.8×10$^{17}$ cm$^{-3}$, with a 1.6-μm-thick GaInAs layer 116, n-doped to n=5×10$^{16}$ cm$^{-3}$ (first low doped buffer layer) acting as lower waveguide core. On top of this lower waveguide core 116, twenty stages of the "two-phonon resonance" structure 112 and thirty stages of the "bound-to-continuum" structure 114 are grown and serve as the active region 103 of the QCL, wherein the two QC structures 112 and 114 are separated by a 200 nm-thick GaInAs spacer (not shown in FIG. 4($a$)), n-doped to n=5×10$^{16}$ cm$^{-3}$. $Al_{0.48}In_{0.52}As$ and $In_{0.53}Ga_{0.47}As$ are the materials used in this embodiment for the two QC structures, and the layer sequences for the two structures, in nanometers (starting from the injector barrier—see FIGS. 5($a$) and ($b$)), are: 40, 20, 7, 60, 9, 59, 10, 52, 12, 38, 12, 32, 12, 32,16,31,19, 31, 22, 30, 22, 29 and 40, 18, 9, 54, 11, 53, 11, $\overline{48, 22, 34, 14}$, 33, 13, 32, 15,31,19,30, 23, 29, 25, 29, respectively. The barriers are indicated in bold face and the underlined layers are doped to n=4×10$^{17}$ cm$^{-3}$.

The growth ends with a 1.5-μm-thick GaInAs layer 118, n-doped to n=5×10$^{16}$ cm$^{-3}$ (second low doped buffer layer) acting as upper waveguide core. The wafer is then transferred to a MOCVD chamber and a 10-μm-thick InP layer 120, n-doped to n=10$^{17}$ cm$^{-3}$, is overgrown to provide the top waveguide cladding for both mid-infrared and THz modes. As shown in FIG. 3, the material may be processed into deep etched ridge waveguides approximately 2 mm long and 15-25 μm wide, with a 400-nm-thick Si$_3$N$_4$ insulating layer 110 on the lateral walls of the ridge and a Ti/Au (20 nm/400 nm) top contact 108. A non-alloyed Ge/Au contact 124 is deposited on the back of the substrate 122. A high-reflectivity coating, comprising Al$_2$O$_3$/Au (200 nm/50 nm) layers (not shown in FIG. 4(a)), is evaporated on a rear facet of the devices. Furthermore, a grating 105 optionally may be disposed on the surface of the waveguide structure and configured to extract the DFG radiation along a length of the waveguide.

Figure 4A:
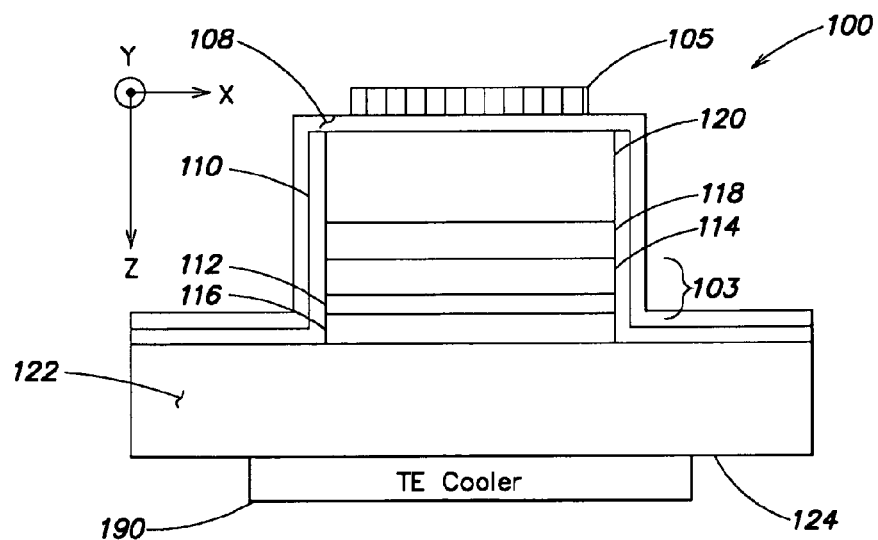
FIGS. 4(a), (b), (c) and (d) illustrate additional details of waveguide structure, refractive index profile, and waveguide modes of the QCL shown in FIG. 3, according to one inventive embodiment of the present disclosure.
Figure 4B:
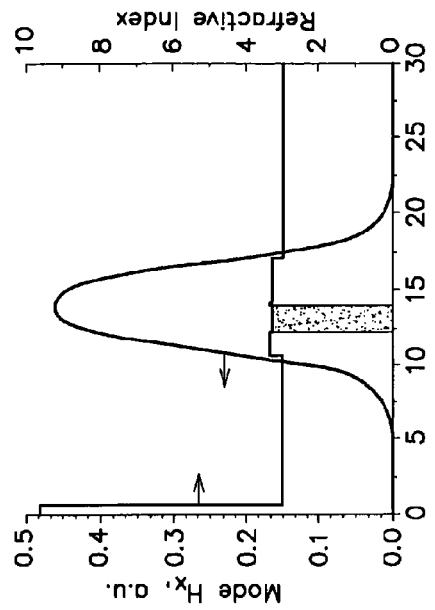
Figure 4D:
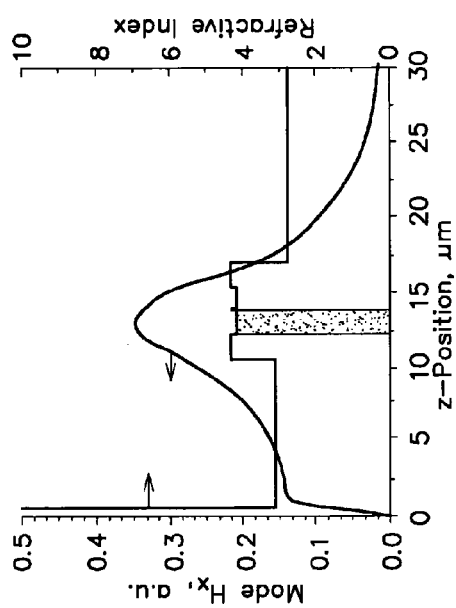
Figure 4C:
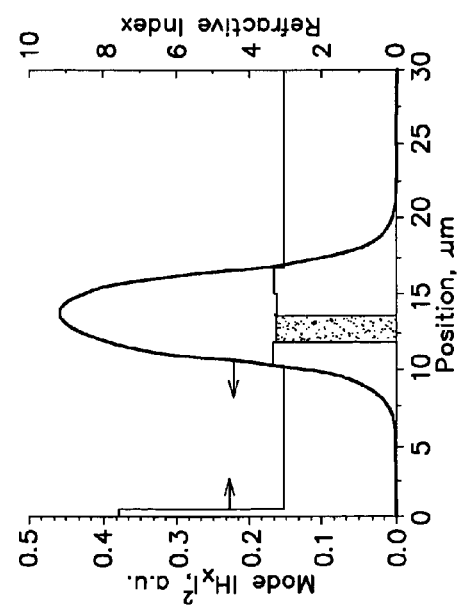

FIGS. 4(b), (c) and (d) illustrate magnetic field intensity in TM$_{00}$ waveguide mode for the modes at λ=7.6 micrometers (b), 8.7 micrometers (c) and 60 micrometers (d). The values of H$_x$ are normalized so that ∫(H$_x$)$^2$dz [in μm]=1. Also shown is the refractive index profile, wherein the region with large nonlinear susceptibility is shaded. Refractive indices for the Al$_{0.48}$In$_{0.52}$As and In$_{0.53}$Ga$_{0.47}$As compounds may be obtained using linear interpolation between the data for the binary compounds and the Drude model with the relaxation time constant τ=10$^{-13}$ sec to account for the free-carrier contribution. This approach is known to work well in the mid-infrared; it should be noted, however, that it is not very accurate for the wavelength of 60 μm, because of the proximity of the Reststrahlenband and the strong dependence of the optical phonon energies on the material composition. For the TM$_{00}$ modes in a 20 μm-wide ridge waveguide, effective refractive indices n$_{eff}$, of 3.266+i×0.00057, 3.248+i×0.00080, and 2.981+i×0.161 are obtained for the wavelengths of 7.6 μm, 8.7 μm, and 60 μm, respectively. From this data, a phase mismatch, k−(k$_1$−k$_2$), of approximately (420+170i)cm$^{-1}$ is estimated, which corresponds to a coherence length, l$_{coh}$=1/|k−(k$_1$−k$_2$)|, of approximately 22 μm.

Figure 5A:
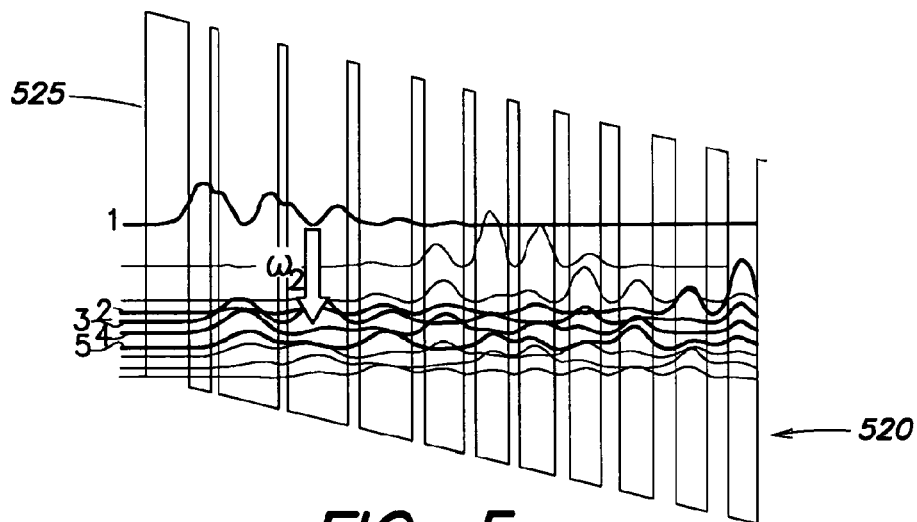
FIGS. 5(a) and (b) illustrate calculated conduction band diagrams for one period of the second QC structure (a) and the first QC structure (b), respectively, of the active region of the QCL shown in FIGS. 3 and 4(a), according to one inventive embodiment of the present disclosure.
Figure 5B:
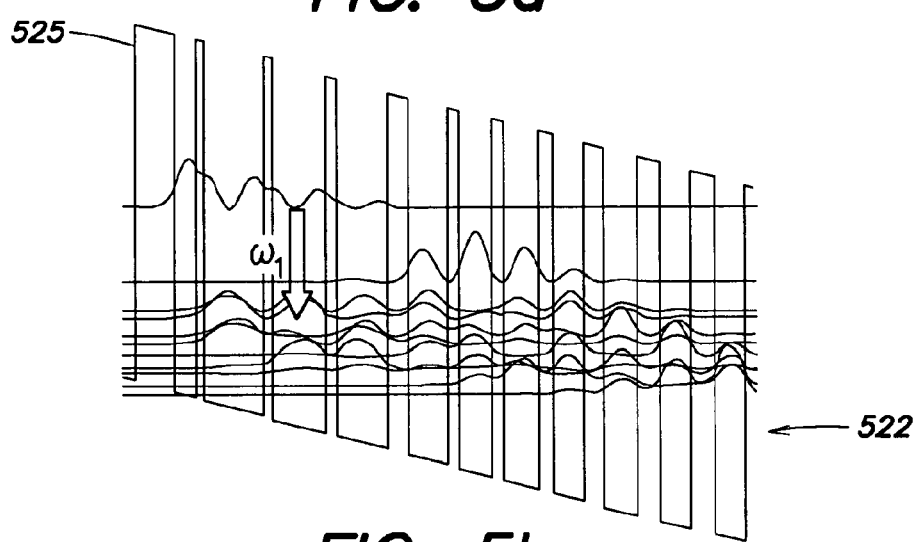
FIG. 5(c) is an energy level diagram illustrating the THz resonant DFG process based on the conduction band diagrams shown in FIGS. 5(a) and 5(b), according to one inventive embodiment of the present disclosure.

FIG. 5(a) illustrates calculated conduction band diagrams of one period 520 of the 30-stage stack of a "bound-to-continuum" second QC structure 114 with integrated second order optical nonlinearity shown as forming part of the active region 103 of the QCL 100 illustrated in FIGS. 3 and 4(a). Similarly, FIG. 5(b) illustrates calculated conduction band diagrams of one period 522 of the 20-stage stack of a "two-phonon resonance" QC structure 112 constituting part of the active region 103 of the QCL 100. In these diagrams, the wavy curves represent the moduli squared of the wavefunctions of the relevant quantum states. The electron states in the "bound-to-continuum" section important for DFG are shown in bold and labeled 1 to 5 in FIG. 5(a). The injector barriers 525 for both structures (i.e., the barrier through which an electron needs to tunnel to get to the structure) are indicated as the left-most barrier in the drawings.

Figure 5C:
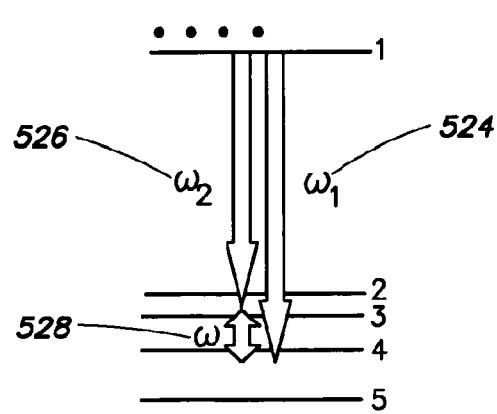

The schematics of the THz resonant DFG process in the active region 103 of the QCL 100 shown in FIGS. 3 and 4(a), based on the conduction band diagrams shown in FIGS. 5(a) and 5(b), are illustrated in the energy level diagram of FIG. 5(c), with the relevant energy levels from FIG. 5(a) shown in bold and also labeled in FIG. 5(c). In particular, FIG. 5(c) illustrates that the QCL 100 is configured to generate first radiation at a first frequency ω$_1$ (524), second radiation at a second frequency ω$_2$ (526), and third radiation at a third frequency ω=ω$_1$−ω$_2$ (528) based on difference frequency generation (DFG) arising from the nonlinear susceptibility. In this DFG process, the expression for the second-order nonlinear susceptibility is given by:

$$\chi^{(2)}(\omega = \omega_1 - \omega_2) \approx N_e \frac{e^3}{\hbar^2 \varepsilon_0} \qquad (2)$$
$$\sum_{n,n'} \frac{z_{1n} z_{nn'} z_{n'1}}{(\omega - \omega_{n1} + iT_{n1})} \left( \frac{1}{(\omega_1 + \omega_{n'1} + iT_{n'1})} + \frac{1}{(-\omega_2 - \omega_{n1} + iT_{n1})} \right),$$

where N$_e$ is the electron density in the upper laser level 1, n and n' are the levels in the dense manifold of states (FIG. 3a), and ez$_{ij}$, ω$_{ij}$ and Γ$_{ij}$ are the dipole matrix element, frequency, and broadening of the transition between states i and j. Here it is assumed that most of the electron population is in upper laser level 1 and the populations in the lower laser levels are neglected. In this specific exemplary implementation, the largest contribution to χ$^{(2)}$ comes from states 1, 3, and 4 in FIGS. 5(a) and (c). Inserting the calculated dipole matrix elements and energy spacings into Eq. (2), and assuming broadenings Γ$_{ij}$≈10 meV, and that most of the electrons are in the upper laser state, a second-order nonlinear susceptibility χ$^{(2)}$≈4×10$^5$ pm/V is estimated for a DFG process between two laser pumps at 7.6 and 8.7 micrometer wavelengths, respectively. In practice, the actual value of χ$^{(2)}$ for a given implementation may be smaller because of the more uniform electron population distribution in the laser states; additionally, the uncertainty in the values of the intersubband transition energies and linewidths may account for smaller actual values of χ$^{(2)}$. As discussed further below in connection with FIG. 11, a more refined formalism for more accurately estimating χ$^{(2)}$ may take into consideration the laser "gain=loss" condition.

Various measurements were made on exemplary QCLs fabricated according to the process discussed above in connection with FIGS. 3 and 4(a). A Fourier transform infrared spectrometer was used for spectral measurements of both the mid-infrared and the THz emission. A Mercury Cadmium Telluride detector and a helium-cooled silicon bolometer were used for mid-infrared and THz spectral measurements, respectively. Power measurements were done with a calibrated thermopile detector and a calibrated bolometer for mid-infrared and THz emission, respectively. The power collection efficiency was estimated to be approximately 70% for mid-infrared and below 10% for THz measurements. The data presented in the various figures discussed further below are not corrected for the collection efficiency. Optical filters were used in order to discriminate both mid-infrared pumps and THz DFG.

Figure 6:
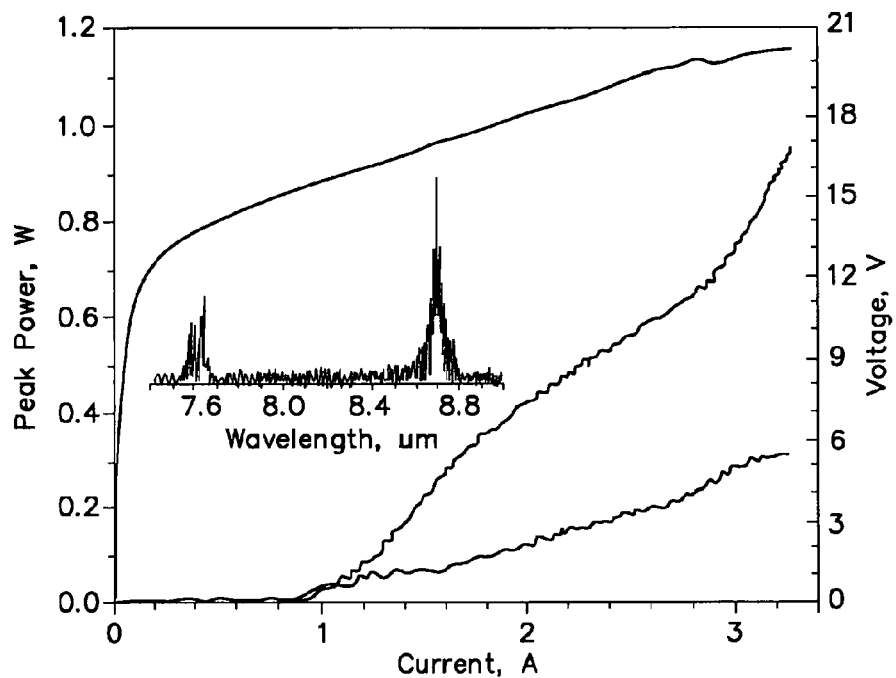
FIG. 6 is a graph illustrating a typical mid-infrared emission spectrum from exemplary QCLs similar to those shown in FIGS. 3 and 4(a), as well as typical current-voltage (I-V) and light output versus current (L-I) characteristics of such QCLs, according to one inventive embodiment of the present disclosure.

A typical mid-infrared emission spectrum from exemplary ridge waveguide devices fabricated as discussed above in connection with FIGS. 3 and 4(a) is shown in the inset of FIG. 6. The pump emission wavelengths are around λ≈7.6 μm and λ≈4.7 μm. The devices operate in dual-wavelength mode up to approximately 250 degrees Kelvin and provides single wavelength emission (λ≈7.6 μm) at room temperature. FIG. 6 also illustrates typical current-voltage (I-V) and light output versus current (L-I) characteristics of the devices obtained at 10 degrees Kelvin in pulsed mode (60 ns pulses at 200 kHz) with a 20-μm-wide, 2-mm-long ridge device having a back facet high-reflection coating. The peak powers of the 7.6 μm and 8.7 μm pump lasers are plotted in the lower two curves, respectively. The data is not corrected for the estimated 70% power collection efficiency.

Figure 7A:
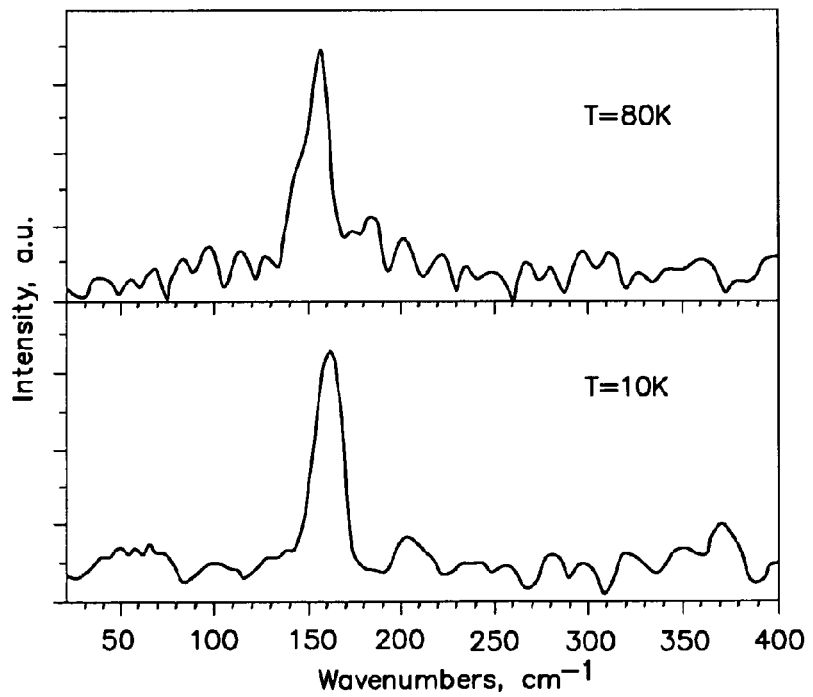
FIG. 7a is a graph illustrating THz spectra collected at different temperatures from an exemplary ridge waveguide QCL similar to those shown in FIGS. 3 and 4(a), according to one inventive embodiment of the present disclosure.

THz spectra from a representative ridge waveguide QCL, collected at different temperatures, are shown in FIG. 7a. These spectra were obtained from a 20-μm-wide, 2-mm-long ridge device with a back facet high-reflection coating. Again, the device was operated in pulsed mode, with peak current of 3.6 amps in 60 nanosecond pulses at 500 kHz. The spectral position of the THz signal is in agreement with the difference of the frequencies of the mid-infrared pumps. The maximum DFG output power at 10 degrees Kelvin and 80 degrees Kelvin was comparable, and it was approximately a factor of 5 smaller at 150 degrees Kelvin, the maximum temperature at which DFG was observed in this specific exemplary device. The decrease with temperature of the DFG signal can be attributed to the reduction of the mid-infrared pump intensities with temperature. In particular, the product of the peak powers of the two mid-infrared pumps at 10 degrees Kelvin and 80 degrees Kelvin was similar and that at 150 degrees Kelvin was smaller by approximately a factor of four.

Figure 7B:
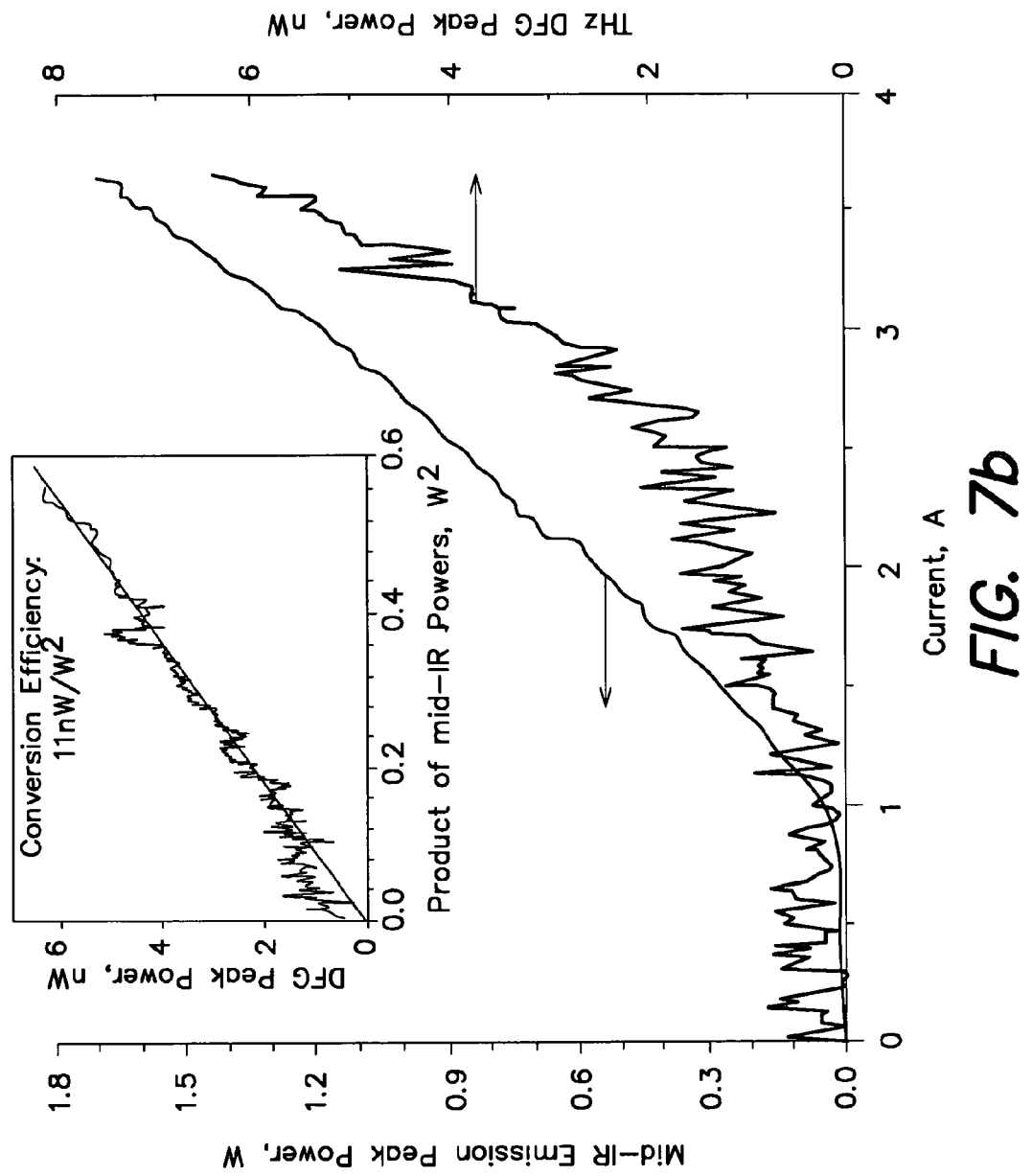
FIG. 7b is a graph illustrating the dependence of the peak THz DFG power and of the total mid-infrared emission power on the injection current, as well as the THz DFG power versus the product of the powers of two mid-infrared pumps, for an exemplary ridge waveguide QCL similar to those shown in FIGS. 3 and 4(a), according to one inventive embodiment of the present disclosure.

The dependence of the peak THz DFG power and of the total mid-infrared emission power on the injection current at 10 degrees Kelvin for a typical device is shown in FIG. 7b. The THz DFG power versus the product of the powers of two mid-infrared pumps is plotted in the inset of FIG. 7b. A linear dependence, expected from Eq. (1), is clearly observable with the slope efficiency of 11 nW/W$^2$. The data is not corrected for the estimated 70% and 10% power collection efficiency for mid-infrared and THz measurements, respectively.

To estimate the THz DFG conversion efficiency in a QCL, the variation of $\chi^{(2)}$ across the QCL waveguide and a non-uniform field intensity distribution in the waveguide should be considered. In the following analysis, it is assumed that the powers of the pump waves are much larger than that of DFG emission and the generic textbook approach is followed to derive the expression for DFG conversion efficiency in the case of coupled TM-polarized waveguide modes.

The nonlinear polarization $P^{(2)}$ induced at frequency $\omega = \omega_1 - \omega_2$ by the two mid-infrared pumps at frequencies $\omega_1$ and $\omega_2$ acts as a radiation source of the wave at frequency $\omega$. For coupled quantum well systems, $P^{(2)}$ is polarized perpendicular to the waveguide layers and, therefore, contributes to TM-polarized waveguide modes only. The magnetic field amplitude of the mode at frequency $\omega$ in a waveguide can be written as $$H(x,y,z,t) = H_\omega(x,z) \times h(y) \times e^{i(\omega t - ky)}, \tag{S1}$$

where the coordinate system in shown in FIG. 4(a), $H_\omega(x,z) \times e^{i(\omega t - ky)}$ is a mode in the passive waveguide (i.e. without $P^{(2)}$) and $h(y)$ is a slowly varying amplitude that accounts for the increase of the mode intensity as it propagates in the waveguide with $P^{(2)}$. Inserting the expression for $H(x,y,z,t)$ into the wave equation and neglecting the second derivative of $h(y)$ (using slow-varying amplitude approximation) we obtain $$2ik \frac{\partial h(y)}{\partial y} \times H_\omega(x,z) e^{i(\omega t - ky)} = i\omega \frac{\partial P^{(2)}(x,y,z,t)}{\partial y}. \tag{S2}$$

Here we utilized the fact that $H_\omega(x,z) \times e^{i(\omega t - ky)}$ is the solution of the wave equation for the passive waveguide. Using the orthogonality of waveguide modes of different order, we obtain for $h(y)$:

$$\frac{\partial h(y)}{\partial y} = \frac{\omega}{2k} \frac{\int H_\omega(x,z) \frac{\partial P^{(2)}(x,y,z,t)}{\partial y} e^{-i(\omega t - ky)} dx\, dz}{\int (H_\omega(x,z))^2 dx\, dz} \tag{S3}$$

The nonlinear polarization is induced by the electric fields of the mid-infrared pump modes $$P^{(2)}(x,y,z,t) = \epsilon_0 \chi^{(2)}(x,z) E_{\omega_1}{}^z(x,z) E_{\omega_2}{}^z(x,z) \times e^{-i((\omega_1 - \omega_2)t - (k_1 - k_2)y)}, \tag{S4}$$

where $E_{\omega_1}{}^z(x,z)$ is the z-component of the electric field amplitude of the mode at frequency $\omega_1$. Using the relationship between the electric and magnetic fields in a TM-polarized mode we have $$E_{\omega_i}^z(x,z) = \frac{n_{eff}^{\omega_i}}{c} \frac{H_{\omega_i}(x,z)}{\epsilon_0 \epsilon_{\omega_i}(x,z)}, \tag{S5}$$

where $n_{eff}^{\omega_1}$ and $k_i$ are the effective refractive index and the wave vector of the mode at frequency $\omega_i$. Inserting Eqs. (S4) and (S5) into Eq. (S3) and integrating over y, we obtain $$h(y) \approx -\frac{\epsilon_0 \omega}{2} \frac{\int H_\omega(x,z) \frac{n_{eff}^{\omega_1}}{c} \frac{H_{\omega_1}(x,z)}{\epsilon_0 \epsilon_{\omega_1}(x,z)} \frac{n_{eff}^{\omega_2}}{c} \frac{H_{\omega_2}(x,z)}{\epsilon_0 \epsilon_{\omega_2}(x,z)} \chi^{(2)}(x,z) dx\, dz}{\int (H_\omega(x,z))^2 dx\, dz} \times \frac{e^{i(k-(k_1-k_2))y}}{i(k-(k_1-k_2))},$$

where we utilized the fact that that $\omega = \omega_1 - \omega_2$ and assumed that $(k_1 - k_2)k \approx 1$. To calculate the power of the DFG emission we integrate the time-averaged Poynting vector of the mode at frequency $\omega$, $$W(\omega) \approx \left\langle \int E(x,z,t) H(x,z,t) dx\, dz \right\rangle = \tag{S7}$$

$$2 \frac{n_{eff}^\omega}{c} \int \frac{(H_\omega(x,z))^2}{\epsilon_0 \epsilon_\omega(x,z)} dx\, dz \times (h(y))^2$$

where $\langle \rangle$ is the time average and the real field intensities are expressed as $E(x,z,t) = E_\omega{}^t(x,z) e^{-i\omega t} + c.c.$ Inserting the expression for $h(y)$ from Eq. (S6) into Eq (S7) and normalizing the expression by the two intensities of the pump waves, we obtain the expression for the power of the DFG wave, after some simplification, $$W \approx \frac{1}{8} \frac{n_{eff}^\omega n_{eff}^{\omega_1} n_{eff}^{\omega_1} \omega^2}{\epsilon_0 c^3} \times$$

$$\frac{\int \frac{(H_\omega(x,z))^2}{\epsilon_\omega(x,z)} dx\, dz \left| \int H_\omega(x,z) \frac{\frac{H_{\omega_1}(x,z)}{\epsilon_{\omega_1}(x,z)}}{\frac{H_{\omega_2}(x,z)}{\epsilon_{\omega_2}(x,z)}} \chi^{(2)}(x,z) dx\, dz \right|^2}{(\int (H_\omega(x,z))^2 dx\, dz)^2} W_1 W_2 \times l_{coh}^2$$

$$\int \frac{(H_{\omega_1}(x,z))^2}{\epsilon_{\omega_1}(x,z)} dx\, dz \int \frac{(H_{\omega_1}(x,z))^2}{\epsilon_{\omega_2}(x,z)} dx\, dz$$

Here $W_i$ is the power of the mode at frequency $\omega_i$ and $l_{coh}=1/|k-(k_1-k_2)|$. This expression can be further simplified by assuming $\epsilon(x,z) \approx (n_{\it eff})^2$. We then obtain $$W \approx \frac{\omega^2}{8\varepsilon_0 c^3 n_{\it eff}^\omega n_{\it eff}^{\omega_1} n_{\it eff}^{\omega_2}} \times \frac{|\chi^{(2)}|^2}{S_{\it eff}} W_1 W_2 \times l_{coh}^2, \qquad (S9)$$

where $\chi^{(2)}$ is the peak value of the nonlinear susceptibility in a QCL waveguide and the effective area of interaction, $S_{\it eff}$, is given as $$S_{\it eff} = |\chi^{(2)}|^2 \frac{\int (H_\omega(x,z))^2 dx dz \int (H_{\omega_1}(x,z))^2 dx dz \int (H_{\omega_2}(x,z))^2 dx dz}{|\int H_\omega(x,z) H_{\omega_1}(x,z) H_{\omega_2}(x,z) \chi^{(2)}(x,z) dx dz|^2} \qquad (S10)$$

Note that, for plane waves, the beam intensity is I=W/S and, with constant $\chi^{(2)}$, we recover the DFG intensity expression which is given in the plane wave approximation.

To estimate the THz DFG conversion efficiency in a QCL waveguide, we evaluate the integral in Eq. (S 10) using the mode profiles shown in FIGS. 4(b), (c), and (d) and neglecting the dependence of the field intensity in x-direction, see FIG. 4(a). Assuming that the mid-infrared pumps are $TM_{00}$ modes and verifying that the DFG is most efficient for $TM_{00}$ mode, we obtain for a 20-μm-wide ridge device $S_{\it eff} \approx 1800$ μm². With $l_{coh}=22$ μm, this results in an internal conversion efficiency $\eta_{int}=W/(W_1 W_2)$ of ~700 μW/W², where the powers $W_i$ are measured inside the QCL waveguide. To evaluate the external conversion efficiency, $\eta_{ext}=W/(W_1 W_2)$, where the powers $W_i$ are measured outside the QCL waveguide, we may use the Fresnel formulas and calculated $n_{\it eff}$ to estimate the laser front facet transmittivity. We obtain power transmission coefficient of ~0.7 for all three wavelengths and obtain $\eta_{ext}$~1 mW/W². Note that, for $\lambda=60$ μm and a ridge waveguide cross-section of ~15×20 μm², the actual front facet transmission coefficient may be significantly smaller than that given by the Fresnel formulas. This would result in a smaller value of $\eta_{ext}$.

In sum, in the example discussed above in connection with the embodiment of FIG. 4(a), there was no attempt to achieve phase matching and the coherence length was not maximized. The phase mismatch between the $TM_{00}$ pump and THz DFG modes, $k-(k_1-k_2)$, is estimated to be approximately 420 cm$^{-1}$ and the losses for THz DFG, α, to be ~340 cm$^{-1}$, which translates into a coherence length of ~22 μm, see Eq. (1). Theoretical estimates using $l_{coh}=22$ μm, $\chi^{(2)} \approx 4 \times 10^5$ pm/V, and assuming mid-infrared lasing only in $TM_{00}$ modes predict DFG conversion efficiency to be of the order of 1 mW/W² in a waveguide geometry. The measured value of the conversion efficiency, corrected for the mid-infrared and THz DFG signal collection efficiencies, is approximately 50 nW/W². The discrepancy may result from a number of factors, including mid-infrared lasing in many higher order lateral modes, the actual value of $\chi^{(2)}$ being significantly smaller, poor THz wave out-coupling, etc.

While a 10 μm-thick InP top waveguide cladding 120, grown by Metalorganic Chemical Vapor Deposition (MOCVD), was employed in the embodiment of FIG. 4(a) to provide dielectric mode confinement for the mid-infrared and THz modes, according to another embodiment a combined dielectric/metal-surface-plasmon waveguide structure may be employed, in which mid-infrared pumps are confined in the dielectric waveguide core and the THz mode is guided by the metal layer(s)/wall(s), similarly to that of previously studied THz QCLs (not based on DFG). Although the metal layers are good for the THz mode, they introduce high losses for the mid-infrared field. Therefore, the mid-infrared mode should have a low overlap with the metallized walls. This can be achieved in a design where the mid-infrared mode is positioned in the center of the thick THz waveguide and naturally dies out to the walls, so that there is very little overlap with the metal.

Figure 8A:
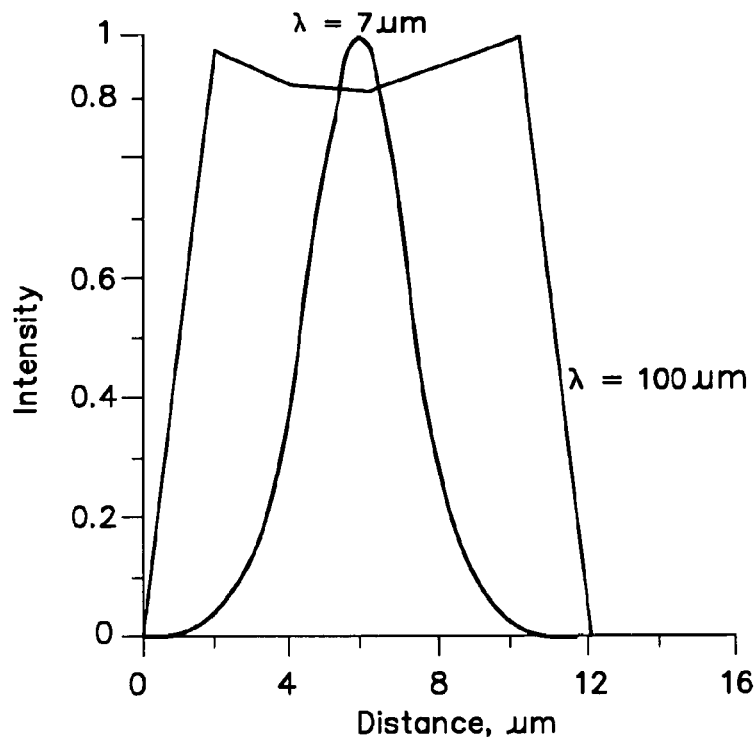
FIGS. 8(a) and (b) illustrate intensity distributions of mid-infrared laser mode and the THz mode, and waveguide structure, respectively, for a QCL according to yet another inventive embodiment of the present disclosure.
Figure 8B:
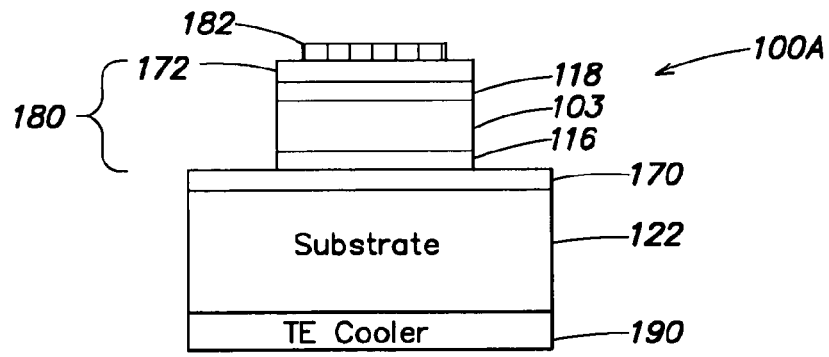

FIG. 8(b) illustrates an example of such a QCL 100A including a surface-plasmon waveguide structure 180, according to another inventive embodiment of the present disclosure, whereas FIG. 8(a) illustrates the intensity distributions of the mid-infrared laser mode (center thinner plot) and the THz mode (wider plot) for the QCL 100A. In particular, the intensity distribution shown in FIG. 8(a) is indicated in the growth direction (distance counted from the top of the waveguide) for the mid-infrared laser mode and THz mode, in an exemplary waveguide of approximately 10.5 μm thickness formed by two metal walls 170 and 172 that serve simultaneously as contacts for the current injection. As shown in FIG. 8(b), the integrated active region 103 occupies the central region (e.g., 4-5 μm) of the waveguide. The remaining part of the waveguide includes a low-doped buffer material (e.g., the layers 116 and 118, similar to those shown in FIG. 4(a)). In one aspect, because of the narrow profile of the mid-infrared pump mode, in some implementations it is not necessary to fill the whole waveguide with the active regions as it is done in THz QC lasers. In another aspect, a grating 182 optionally may be disposed on the surface of the surface-plasmon waveguide structure 180 and configured to extract the DFG radiation along a length of the waveguide.

Figure 9:
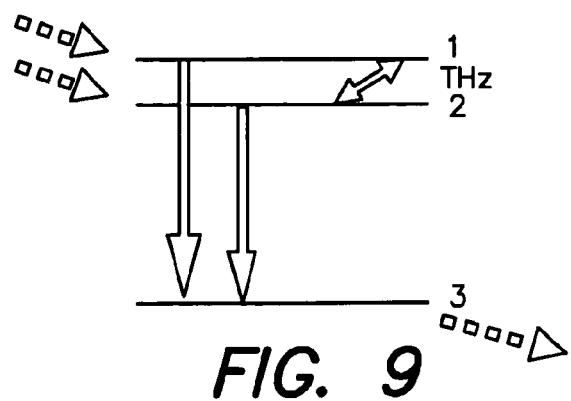
FIGS. 9 and 10 illustrate an energy diagram and conduction band diagram, respectively, for a QCL based on DFG according to yet another inventive embodiment of the present disclosure, comprising a single quantum cascade structure integrated with high nonlinear suceptibility to generate both the pump and DFG frequencies.
Figure 10:
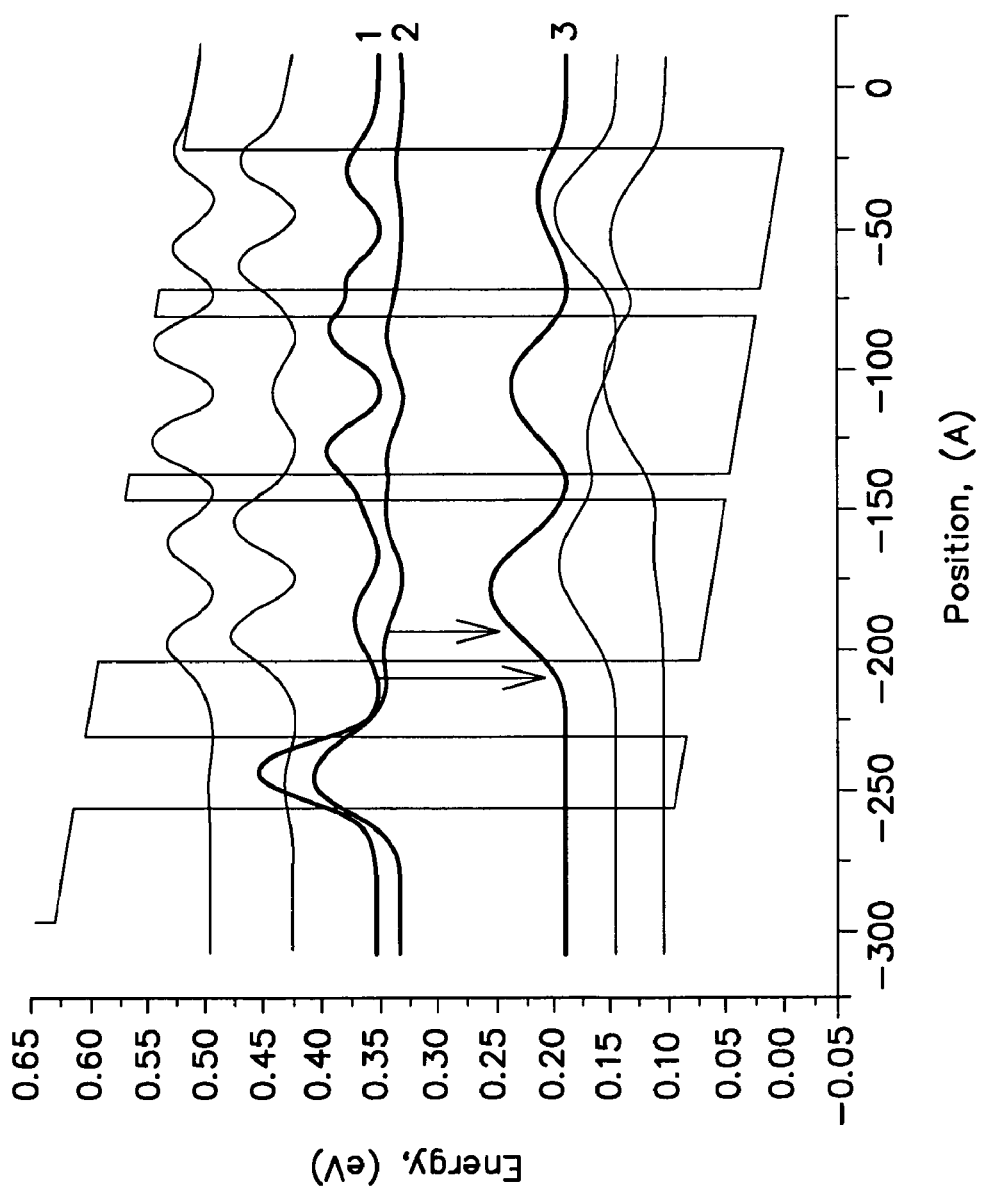

According to yet another embodiment, A QCL based on DFG may comprise a single quantum cascade structure integrated with high nonlinear suceptibility to generate both the pump and DFG frequencies. FIGS. 9 and 10 show an energy diagram and conduction band diagram, respectively, for such a device. The design is based on a modification of the two-phonon resonance structure. In FIGS. 9 and 10, the energy levels responsible for laser action and high second-order non-linearity are shown in bold and labeled 1,2,3. The laser transitions 1 to 3 and 2 to 3 are designed to have the same oscillator strength, and the frequency difference corresponds to THz radiation at 60 μm. Taking an average doping ~5×10$^{16}$ cm$^{-3}$ and assuming the electron population is shared evenly by states 1 and 2, the nonlinear susceptibility for DFG at 60 μm may be as large as 8×10$^5$ pm/V.

In various embodiments of QCLs according to the present disclosure for generating THz radiation, QCLs may be operated to generate continuous-wave (CW) or pulsed radiation, and may further be configured to variably tune the first, second and third frequencies based on controlled variations of operating temperature. To this end, apparatus according to various embodiments may further comprise a thermoelectric (TE) cooler 190 coupled to the QCL (e.g., see FIGS. 4(a) and 8(b)) to control (stabilize at a fixed point or vary) the operating temperature of the QCL. In one aspect, the TE cooler may be a single or multiple stage cooler, and may be configured to provide a QCL operating temperature over a range from approximately 195 to 295 degrees Kelvin.

Figure 11:
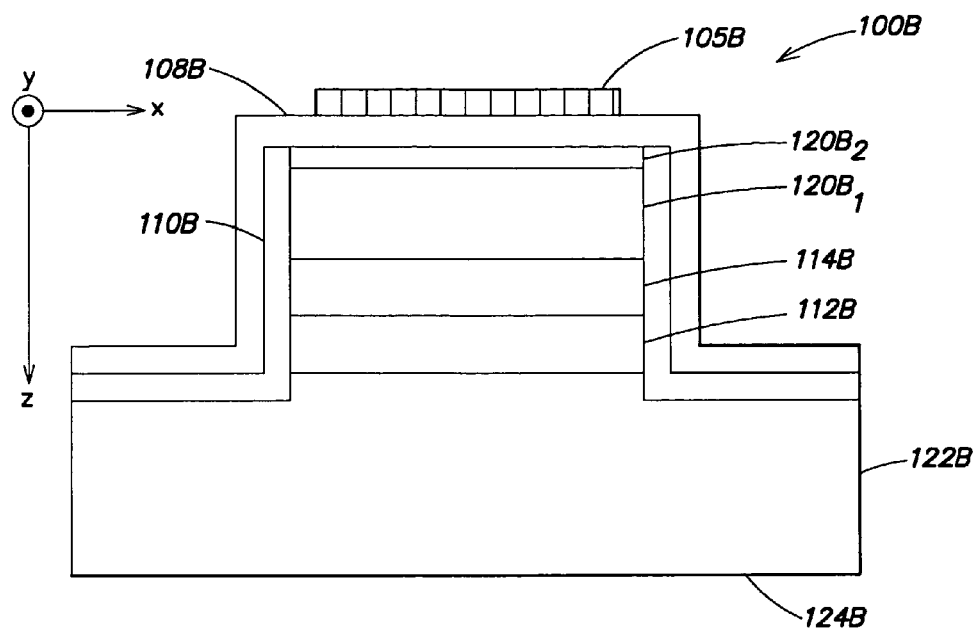
FIG. 11 illustrates a cross-section of a waveguide structure for a QCL according to another inventive embodiment of the present disclosure.

In yet other exemplary implementations pursuant to the inventive concepts discussed above, various modifications are contemplated to the general waveguide structure illustrated in FIG. 4(a) to realize THz QCLs that may be tailored for different operating wavelengths and/or operating performance metrics. FIG. 11 illustrates one such example of a waveguide structure for a QCL generally similar to that shown in FIG. 4(a), but with some variations, according to another inventive embodiment of the present disclosure. In one exemplary implementation based on the waveguide structure shown in FIG. 11, a THz QCL based on DFG according to the concepts discussed above may be designed to operate in the mid-infrared at wavelengths $\lambda_1=8.9$ μM and $\chi_2=10.5$ μm and produce terahertz output at $\lambda=60$ μm, with 7 μW output power at 80 degrees K., approximately 1 μW output power at 250 degrees K., and approximately 300 nW output power at 300 degrees K. (i.e., approximately room temperature and above).

Figure 13:
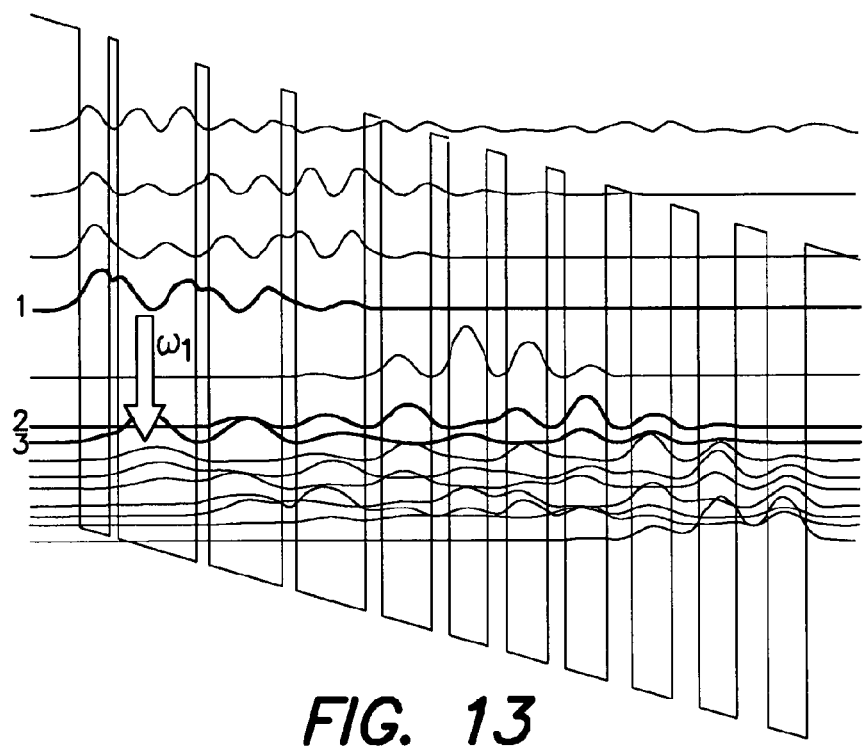
FIG. 13 illustrates a calculated conduction band diagram for one period of the bound-to-continuum QC structure of the QCL shown in FIG. 11.

More specifically, the QCL 100B shown in FIG. 11 is based on a $In_{0.53}Ga_{0.47}As/In_{0.52}Al_{0.48}As$ heterostructure grown by molecular beam epitaxy (MBE). In particular, MBE growth starts on an InP substrate 122B, n-doped to $9\times10^{16}$ cm$^{-3}$, with 30 stages of the two-phonon resonance QC structure 112B, designed to emit at 10.5 μm, followed by 100-nm-thick GaInAs spacer, n-doped to $3\times10^{16}$ cm$^{-3}$ (not shown in FIG. 11) and 30 stages of the bound-to-continuum QC structure 114B, designed to emit at 8.9 μM. For this exemplary apparatus, the layer sequence for one period of the bound-to-continuum structure 114B (in A), starting from the injection barrier, is 40/24/7/65/8/64/8/58/22/40/13/38/14/37/15/36/19/36/25/36/25/35, whereas the layer sequence for one period of the two-phonon resonance structure 112B is 40/20/7/60/9/59/10/52/14/38/12/32/12/32/16/31/19/31/22/30/22/29. The barriers are indicated in bold face and the underlined layers are doped to n=$3\times10^{17}$ cm$^{-3}$. The calculated conduction-band diagram of one period of the bound-to-continuum structure at applied bias of 37 kV/cm is shown in FIG. 13. As above, the wavy curves represent the moduli squared of the wavefunctions. The electron states important for DFG are shown in bold and labeled 1 to 3.

In the QCL 100B of FIG. 11, the MBE growth ends with a 50-nm-thick GaInAs layer, n-doped to $3\times10^{16}$ cm$^{-3}$ (not shown in FIG. 11). An upper waveguide cladding comprising a 3.5-μm-thick layer 120B, and a 0.2-μm-thick InP layer 120B$_2$, n-doped to $5\times10^{16}$cm$^3$ and $5\times10^{18}$ cm$^{-3}$, respectively, is then overgrown by MOCVD. As with the QCL shown in FIG. 4(a), in some implementations the material may be processed into deep etched ridge waveguides approximately 2 mm long and 15-25 μm wide (e.g., see FIG. 3), with a 400-nm-thick Si$_3$N$_4$ insulating layer 110B on the lateral walls of the ridge and a Ti/Au (20 nm/400 nm) top contact 108B. A non-alloyed Ge/Au contact 124B may be deposited on the back of the substrate 122B. Also, a high-reflectivity coating (e.g., comprising Al$_2$O$_3$/Au (200 nm/50 nm) layers), may be evaporated on a rear facet of the devices. Furthermore, a grating 105B optionally may be disposed on the surface of the waveguide structure and configured to extract the DFG radiation along a length of the waveguide.

With reference again to the discussion above in connection with Eq. (2), in the QCL 100B of FIG. 11, the bound-to-continuum structure 114B has an appreciable $\chi^{(2)}$ for DFG. The electron density in the upper laser state can be determined from a "gain=loss" condition. The laser gain in a medium with population inversion is given by an expression:

$$g(\omega_1) \approx \frac{\omega_1}{cn_{eff}(\omega_1)} \frac{\Delta N_e e^2}{\varepsilon_0 \hbar} \sum_n \frac{|z_{1n}|^2}{(\omega_1 - \omega_{1n}) + iT_{1n}} \quad (3)$$

where $\eta_{eff}(\omega_1)$ is the effective refractive index of the laser mode and n refers to lower laser levels. A "gain=loss" condition for a QCL is given by:

$$g_{max} \times \Gamma = \alpha_{wg} + \alpha_m \quad (4)$$

where $g_{max}$ is peak of the laser gain in Eq. (3), $\Gamma$ is a modal overlap factor with an active region, $\alpha_{wg}$ and $\alpha_m$ are waveguide and mirror losses, respectively. Taking the parameters $\Gamma \approx 0.4$, $\alpha_{wg} \approx 8$ cm$^{-1}$, and $\alpha_m \approx 3$ cm$^{-1}$ for the QCL 100B, a $g_{max} \approx 28$ cm$^{-1}$ is obtained. Taking $\Gamma_{ij} \approx 7.5$ meV, from Eqs. (2), (3) and (4) it may be found that $\Delta N_e \approx 2\times10^{15}$ cm$^{-3}$ and $|\chi^{(2)}| \approx 4\times10^4$ pm/V for the DFG process in our devices.

With respect to the waveguide structure discussed above in connection with FIG. 4(a), some differences between the structures of FIGS. 4(a) and 11 are noted. First, the doping in the active region and waveguide layers is reduced, which results in smaller losses for a THz wave. Second, the waveguide is now designed for phase-matching, k=k$_1$−k$_2$. Using the effective refractive indices calculated for the TM$_{00}$ modes of mid-infrared pumps and a THz wave, as well as the THz mode losses, the coherence length (see Eq. 1) for the QCL of FIG. 11 is approximately 50-80 μm in 25 to 60-μm-wide ridges, approximately three times larger than for the QCL of FIG. 4(a). The limiting factor for $l_{coh}$ is the waveguide losses in THz, which are calculated to be $\alpha \approx 250$ cm$^{-1}$. It should be appreciated that a can be reduced to below 100 cm$^{-1}$ through further reduction of the doping in the substrate, waveguide layers, and active region.

Figure 12:
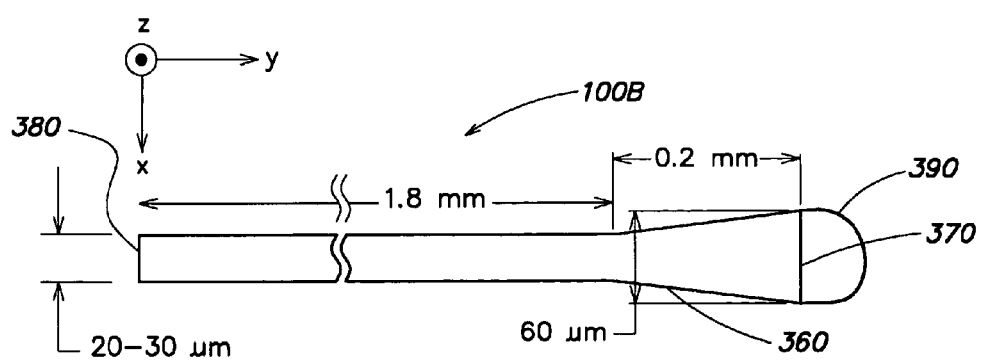
FIG. 12 shows a top view of the waveguide structure of FIG. 11, according to one inventive embodiment of the present disclosure
Figure 14:
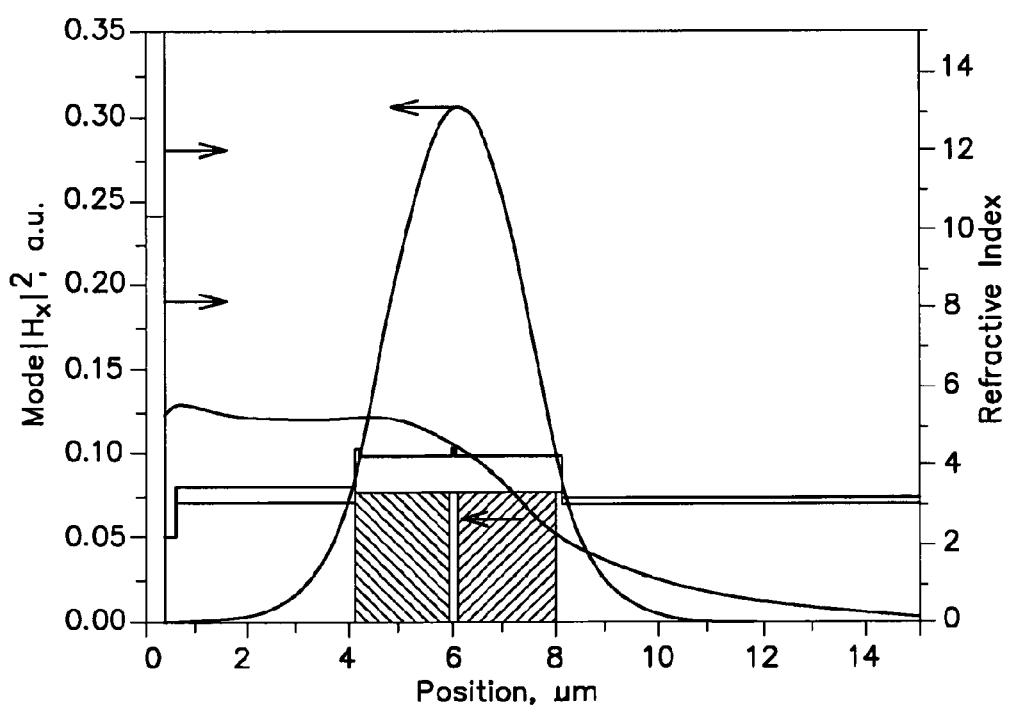
FIG. 14 illustrates the calculated waveguide modes for mid-IR and THz waves, along with the waveguide refractive index profile, for the QCL shown in FIG. 11.

FIG. 12 shows a top view of one implementation of the waveguide structure of FIG. 11. As noted above, the waveguide may be processed so as to form deep etched ridge waveguides approximately 2 mm long and 25 μm wide, including a tapered section 360 widening to approximately 60 μm towards the front facet 370. Again, a high-reflectivity coating comprising Al$_2$O$_3$/Au (200 nm/50 nm) layers may be evaporated on the back facet 380. In one aspect, the tapered section 360 improves the out-coupling efficiency of THz radiation from the waveguide. The calculated waveguide modes for mid-IR and THz waves, along with the waveguide refractive index profile, are shown in FIG. 14. In FIG. 14, the magnetic field intensity in the TM$_{00}$ waveguide mode is indicated on the right axis and the refractive index profile is indicated on the left axis for the wavelength $\lambda$=8.9 μm (thin black line) and 60 μm (thick grey line). Also shown in grey are the two sections of the active region.

Figure 15A:
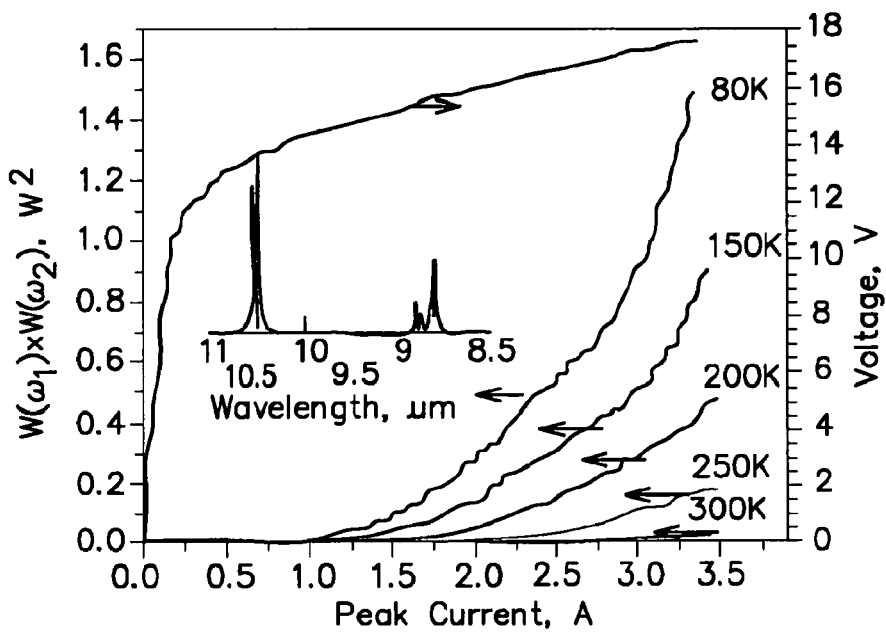
FIGS. 15($a$), ($b$), ($c$), and ($d$) illustrate various operating characteristics of an exemplary QCL designed according to the waveguide structure shown in FIG. 11.
Figure 15B:
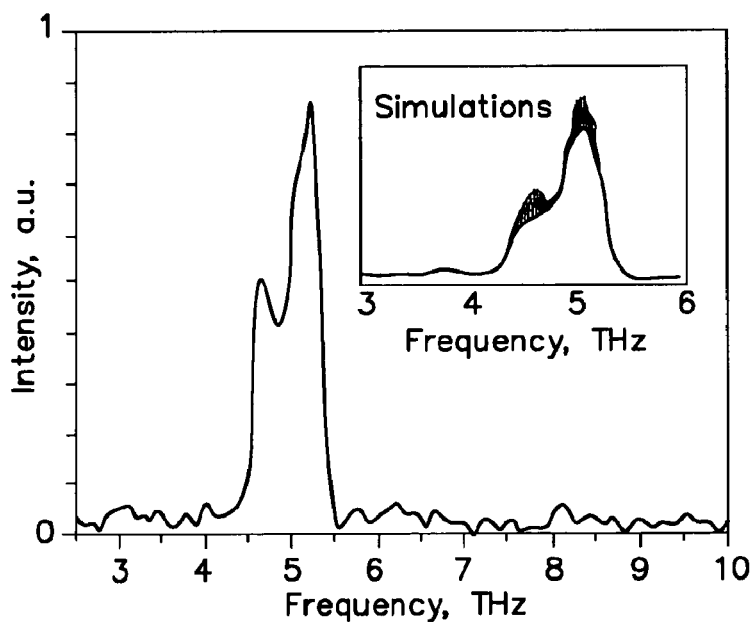

For measurements, exemplary QCLs according to the waveguide structure shown in FIG. 11 were operated in pulsed mode with 60 ns pulses at a 250 kHz repetition rate. Radiation was collected using two 2"-diameter parabolic mirrors: one with a 5 cm focal length to collect light from the device and the other with a 15 cm focal length to refocus it onto a thermopile or mercury-cadmium-telluride (MCT) detector for mid-IR measurements or a He-cooled calibrated silicon bolometer for THz measurements. Mid-IR powers were corrected for 70% collection efficiency of our setup. Spectra were taken with a Fourier transform infrared spectrometer. For THz measurements, mid-IR radiation was blocked using optical filters. These exemplary QCLs operated at dual wavelength up to room temperature. The current-voltage characteristic, the dependence of the product of the two mid-IR pump powers, $W(\omega_1) \times W(\omega_2)$, on current, and a typical emission spectrum for a typical device are shown in FIG. 15(a). The THz emission spectrum at 80K of the same device is shown in FIG. 15(b). For comparison, also shown in FIG. 15(b) is a THz DFG spectrum, simulated using a mid-IR spectrum in FIG. 15(a).

Figure 15C:
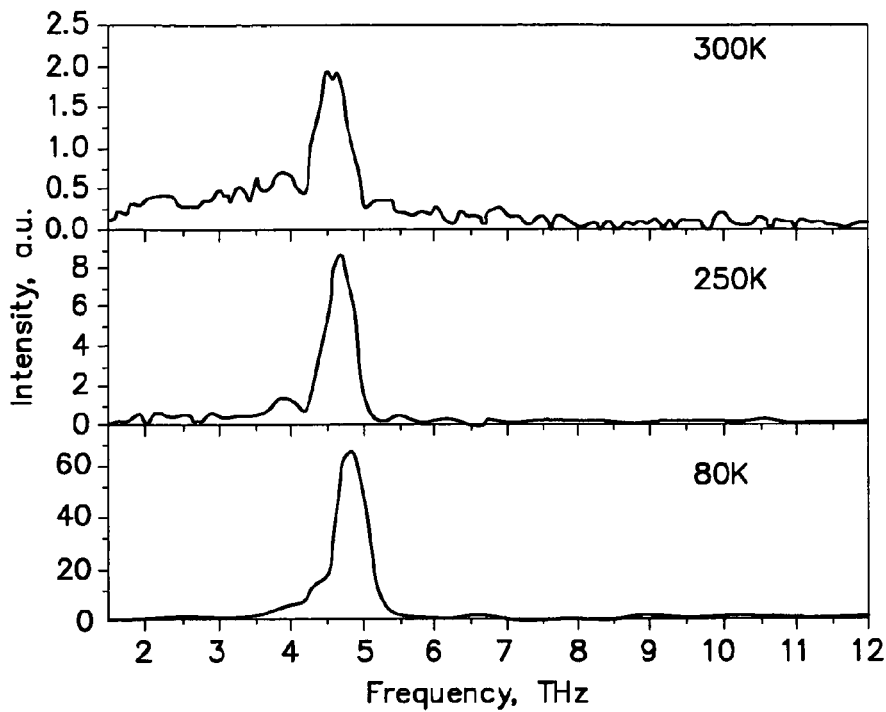
Figure 15D:
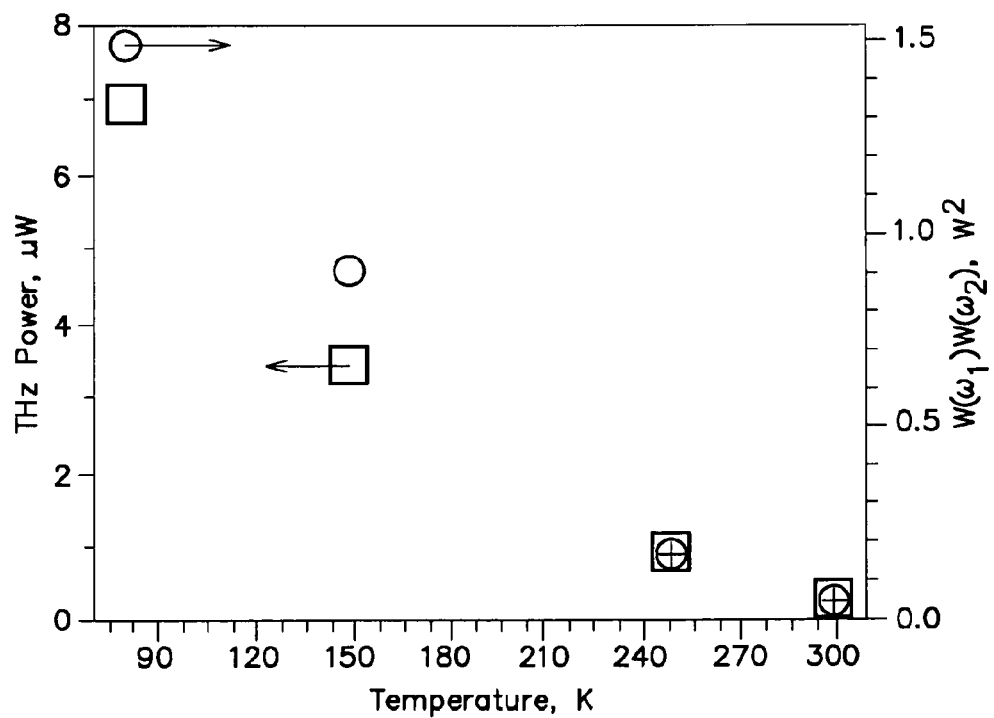

Because of subwavelength THz mode confinement in the waveguide, in one aspect the THz DFG output from the QCLs may be significantly divergent and THz out-coupling efficiency may be poor. Accordingly, in yet another embodiment, a silicon hyperhemispherical lens 390 optionally may be attached to or otherwise in optical communication with (e.g., suitably proximate to) the output facet 370, as shown in FIG. 12. In one exemplary implementation, the lens 390 may be a 2 mm-diameter, 1.19 mm-height high-resistivity silicon hyperhemispherical lens, positioned to within 5 µm of the output facet 370. For lens alignment, a mid-IR output from the QCL may be imaged with an MCT detector. In some implementations, QCLs with a lens demonstrated a 25-fold increase in collected THz DFG power output, compared to devices without a lens. In various aspects, the increase stems from improved collection efficiency (from estimated <10% to approximately 100%) and improvements in THz out-coupling efficiency. Typical THz DFG spectra of a device with a lens, collected at different temperatures, are shown in FIG. 15(c). THz output was observed up to room temperature, with THz power, corrected for the collection efficiency, decreasing from approximately 7 µW at 80K to approximately 1 µW at 250K and 300 nW at room temperature. This trend is demonstrated in FIG. 15(d), where a product of mid-IR pump powers at different temperatures is plotted. The data in FIG. 15(d) indicate that a drop in THz power output originates mostly from a decrease of mid-IR pump powers (see Eq. (1)) while THz DFG conversion efficiency remains constant, ~5 $\mu W/W^2$. The measurements in (d) and all the spectral measurements were done with a device operated with 60 ns 3.5 A current pulses at a repetition rate of 250 kHz.

In sum, according to various embodiments, QCL devices are disclosed that are configured to generate narrow-band radiation at three infrared wavelengths simultaneously, thus spanning the whole mid-to-far-infrared region. Such sources may find application, for example, in spectroscopy of various materials, remote sensing (including detection of explosives), and as a local oscillator in a heterodyne receiver for radio astronomy.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus, comprising: a quantum cascade laser (QCL) having a significant second-order nonlinear susceptibility ($X^{(2)}$) integrated in an active region of the QCL, the QCL configured to generate first radiation at a first frequency $\omega_1$, second radiation at a second frequency $\omega_2$, and third radiation at a third frequency $\omega_{3=\omega 1}-\omega_2$ based on difference frequency generation (DFG) arising from the nonlinear susceptibility; wherein the QCL comprises: a first quantum cascade (QC) structure configured to generate the first radiation; and a second QC structure configured to generate the second radiation, wherein the nonlinear susceptibility is integrated in at least one of the first QC structure and the second QC structure; wherein the first QC structure includes at least one two-phonon structure; and the second QC structure includes at least one bound-to-continuum structure.

2. The apparatus of claim 1, wherein the nonlinear susceptibility is integrated in both of the first QC structure and the second QC structure.

3. The apparatus of claim 1, wherein the QCL comprises a single quantum cascade (QC) structure to generate the first, second and third radiation.

4. The apparatus of claim 1 wherein the first radiation and the second radiation have respective first and second wavelengths in the mid-infrared band of the electromagnetic spectrum, and the third radiation has a wavelength in the terahertz (THz) band of the electromagnetic spectrum.

5. The apparatus of claim 1, wherein the apparatus is configured to operate at room temperature.

6. The apparatus of claim 1 wherein the apparatus is configured to variably tune the first, second and third frequencies based on controlled variations of operating temperature, and wherein the apparatus further comprises a thermoelectric cooler coupled to the QCL to control the operating temperature of the QCL.

7. The apparatus of claim 1, wherein the QCL includes a surface plasmon waveguide structure comprising:

first and second conducting planes, wherein the active region is disposed between the first and second conducting planes; and
a low-doped buffer material disposed with the active region between the first and second conducting planes.

8. The apparatus of claim 1, further comprising a grating disposed on the surface plasmon waveguide structure and configured to extract the third radiation along a length of the surface plasmon waveguide structure.

9. A method, comprising: A) integrating a significant second-order nonlinear susceptibility ($X^{(2)}$) in an active region of a quantum cascade laser (QCL) so as to facilitate generation of first radiation at a first frequency $\omega_1$, second radiation at a second frequency $\omega_2$, and third radiation at a third frequency $\omega_3=\omega_1-\omega_2$ based on difference frequency generation (DFG) arising from the nonlinear susceptibility; wherein the QCL comprises a first quantum cascade (QC) structure configured to generate the first radiation and a second QC structure configured to generate the second radiation, and wherein A) comprises: integrating the nonlinear susceptibility in at least one of the first QC structure and the second QC structure; wherein, the first QC structure includes at least one two-phonon structure; and the second QC structure includes at least one bound-to-continuum structure.

10. The method of claim 9, wherein A) comprises:
integrating the nonlinear susceptibility in both of the first QC structure and the second QC structure.

11. The method of claim 9, wherein the QCL comprises a single quantum cascade (QC) structure to generate the first, second and third radiation.

12. The method of claim 9, wherein the first radiation and the second radiation have respective first and second wavelengths in the mid-infrared band of the electromagnetic spectrum, and the third radiation has a wavelength in the terahertz (THz) band of the electromagnetic spectrum.

13. The method of claim 9, further comprising:
operating the QCL at room temperature.

14. The method of any of claim 9, further comprising:
controllably varying an operating temperature of the QCL so as to variably tune the first, second and third frequencies.

15. The method of claim 9, further comprising:
applying a continuous electric current to the QCL so as to operate the QCL in a continuous-wave (CW) mode.

16. The method of claim 9, further comprising:
applying a pulsed electric current to the QCL so as to operate the QCL in a pulsed mode.

* * * * *